(12) United States Patent
Chung

(10) Patent No.: US 11,659,676 B2
(45) Date of Patent: May 23, 2023

(54) CONNECTION STRUCTURE AND ELECTRONIC DEVICE USING THE SAME

(71) Applicant: LANNER ELECTRONICS INC., New Taipei (TW)

(72) Inventor: Cheng-Yen Chung, New Taipei (TW)

(73) Assignee: LANNER ELECTRONICS INC., New Taipei (TW)

( * ) Notice: Subject to any disclaimer, the term of this patent is extended or adjusted under 35 U.S.C. 154(b) by 0 days.

(21) Appl. No.: 17/742,515

(22) Filed: May 12, 2022

(65) Prior Publication Data

US 2023/0100262 A1 Mar. 30, 2023

(30) Foreign Application Priority Data

Sep. 29, 2021 (TW) .................................. 110136228

(51) Int. Cl.
*G06F 1/16* (2006.01)
*H05K 5/00* (2006.01)
*H05K 7/00* (2006.01)
*H05K 7/14* (2006.01)

(52) U.S. Cl.
CPC ......... *H05K 7/1401* (2013.01); *H05K 7/1418* (2013.01); *H05K 7/1438* (2013.01)

(58) Field of Classification Search
CPC .. H05K 7/1401; H05K 7/1418; H05K 7/1438; H05K 7/1402; H05K 7/1417; H05K 7/142; H05K 7/1422; H05K 7/1439; H05K 7/1452
See application file for complete search history.

(56) References Cited

U.S. PATENT DOCUMENTS

| | | | |
|---|---|---|---|
| 6,721,651 B1* | 4/2004 | Minelli | G01C 21/20 701/538 |
| 7,522,943 B2* | 4/2009 | Hutchison | H04M 1/22 455/90.3 |
| 2002/0050981 A1* | 5/2002 | Nuovo | H04M 1/0254 345/169 |
| 2002/0101707 A1* | 8/2002 | Canova, Jr. | G06F 1/1698 361/679.56 |
| 2002/0196228 A1* | 12/2002 | Hirayama | H04M 1/0243 345/156 |
| 2004/0017361 A1* | 1/2004 | Lieu | H04M 1/7246 345/169 |

* cited by examiner

*Primary Examiner* — Anthony M Haughton

(57) ABSTRACT

A connection structure for attaching a first electronic device onto a second electronic device is disclosed. The connection structure comprises an action unit and an assist unit, wherein the action unit and the assist unit are particularly designed to be cooperated to each other in case of connecting the first electronic device to the second electronic device. After the first electronic device is attached to the second electronic device through the connection structure, a first electrical connection portion of an electronic card is inserted into an electronic card slot in the first electronic device, and a second electrical connection portion of the electronic card is inserted into an electronic card slot in the second electronic device, thereby making the two electronic devices communicate with to each other through the electronic card. As a result, the function(s) of the first electronic device is expended.

20 Claims, 17 Drawing Sheets

CONNECTION STRUCTURE AND ELECTRONIC DEVICE USING THE SAME

BACKGROUND OF THE INVENTION

1. Field of the Invention

The present invention relates to the technology field of electronic devices, and more particularly to a connection structure for attaching one electronic device onto another one electronic device.

2. Description of the Prior Art

There are a variety of computer devices applied in modern life, e.g., personal computer, server computer, embedded system computer, industrial computer, in-vehicle infotainment system, security monitoring system, and gaming computer. However, industrial computers are briefly classified into two sorts nowadays.

First of the two sorts of industrial computers is single board computer, which is a complete computer built on a single circuit board, with microprocessor(s), memory, input/output (I/O) and other features required of a functional computer. Single-board computers are commonly made as demonstration or development systems, for educational systems, or for use as embedded computer controllers. However, unlike a desktop personal computer, single board computers often do not rely on expansion slots for peripheral functions or expansion. Therefore, The other one is called computer-on-module (COM), which is a type of single board computer, a subtype of an embedded computer system. Briefly speaking, a computer-on-module (COM) is a type of single board computer made to plug into a carrier board, baseboard, or backplane for system expansion. With the wide applications of IIoT and AIoT, there are a variety of COM devices developed and provided.

For an engineer skilled in designing COM devices, the simplest way to expand at least one functionality of a COM device is to add a daughter board onto the mother board of the COM device. It is conceivable that, in case there are more and more daughter boards disposed on the mother board, it is necessary to re-design the cooling system and the case of the COM device. However, re-designing the cooling system and the case is not easy for the engineer.

In view of this fact, inventors of the present application have made great efforts to make inventive research and eventually provided a connection structure for attaching one electronic device onto another one electronic device.

SUMMARY OF THE INVENTION

The primary objective of the present invention is to disclose a connection structure for attaching a first electronic device onto a second electronic device. The connection structure comprises an action unit and an assist unit, wherein the action unit and the assist unit are particularly designed to be cooperated to each other in case of connecting the first electronic device to the second electronic device. After the first electronic device is attached to the second electronic device through the connection structure, a first electrical connection portion of an electronic card is inserted into an electronic card slot in the first electronic device, and a second electrical connection portion of the electronic card is inserted into an electronic card slot in the second electronic device, thereby making the two electronic devices communicate with to each other through the electronic card. As a result, the function(s) of the first electronic device is expended.

For achieving the primary objective mentioned above, the present invention provides an embodiment of the connection structure, comprising:

an action unit, being slidably disposed on an inner surface of a first plate, wherein the first plate is provided with a plurality of first holes thereon, and the action unit comprising:
- a first board, being provided with an opening thereon, and at least one first connection portion being set on a first edge of the opening;
- a plurality of latch members, being disposed on the first board, and each said latch member having a latch head passing through said first hole so as to be exposed out of the first plate;
- at least one first elastic member, being connected to the first connection portion by a first end thereof, so as to be disposed within the opening; and
- a pressing member, being connected to a front side of the first board, and a pressing head of the pressing member being exposed out of the first plate; and an assist unit, being fixed on the inner surface of the first plate so as to be positioned within the opening, wherein the assist unit comprises a second board provided with at least one second connection portion thereon, and the first elastic member being connected to the second connection portion by a second end thereof;

wherein after making the plurality of latch members be correspondingly engaged with a plurality of latch holes of a second plate, the first plate being connected with the second plate;

wherein in case the first plate is connected with the second plate, the first board is subject to an action force provided by the first elastic member, so as to be positioned at a first position;

wherein after applying a force to the pressing head of the pressing member so as to push the first board to slide from the first position to a second position, each said latch member not engaging with said latch hole, such that the first plate is allowed to be separated from the second plate;

wherein after the first plate is separated from the second plate, applying the force to the pressing head of the pressing member again triggering the first elastic member to provide the action force to the first board, such that the first board is pushed to slide back to the first position.

Moreover, the present invention also provides an electronic device, which comprises a first case accommodating a first main board therein, and is particularly designed to include a connection structure. The connection structure comprises:

an action unit, being slidably disposed on an inner surface of a first plate of the first case, wherein the first plate is provided with a plurality of first holes thereon, and the action unit comprising:
- a first board, being provided with an opening thereon, and at least one first connection portion being set on a first edge of the opening;
- a plurality of latch members, being disposed on the first board, and each said latch member having a latch head passing through said first hole so as to be exposed out of the first plate;
- at least one first elastic member, being connected to the first connection portion by a first end thereof, so as to be disposed within the opening; and a pressing member, being connected to a front side of the first board, and a pressing head of the pressing member being exposed out of the first plate; and an assist unit, being fixed on the inner surface of the first plate so as to be positioned within the opening, wherein the assist unit comprises a second board provided with at least one second connection portion thereon, and the first elastic member being connected to the second connection portion by a second end thereof;

wherein after making the plurality of latch members be correspondingly engaged with a plurality of latch holes of a second plate that is belong to a second case of an external electronic device, the first plate being connected with the second plate, such that the electronic device is attached to the external electronic device;

wherein in case the first plate is connected with the second plate, the first board is subject to an action force provided by the first elastic member, so as to be positioned at a first position;

wherein after applying a force to the pressing head of the pressing member so as to push the first board to slide from the first position to a second position, each said latch member not engaging with said latch hole, such that the electronic device is allowed to be separated from the external electronic device;

wherein after the electronic device is separated from the external electronic device, applying the force to the pressing head of the pressing member again triggering the first elastic member to provide the action force to the first board, such that the first board is pushed to slide back to the first position.

In one embodiment, said connection structure of the present invention further comprises:

a guide unit, being disposed on the inner surface of the first plate, and comprising a first guide member and a second guide member;

wherein there is a first guiding channel formed between the first guide member and the inner surface of the first plate, and there being also a second guiding channel formed between the second guide member and the inner surface of the first plate;

wherein a left side and a right side of the first board are received by the first guiding channel and the second guiding channel, respectively.

In one embodiment, there is an insertion member disposed on a second edge of the opening, wherein the second edge and the first edge being two opposite edges of the opening, and the assist unit further comprises:

a receiving member having a receiving groove, being disposed on the second board, and being faced to the insertion member;

a return spring, being disposed in the receiving groove;

a clamping member, being disposed in the receiving groove, and comprising a base portion connected to the return spring and two latch arms;

wherein in case the first board is positioned at the first position, the two latch arms of the clamping member being stayed out of the receiving groove, and there being a first included angle between the two latch arms;

wherein in case the first board slides from the first position to the second position, the insertion member being plugged into the receiving groove, and the two arms being pushed by the insertion member so as to move back into the receiving groove, such that the first included angle between the two latch arms is lessened to a second included angle, and an insertion head of the insertion member being clamped by the two latch arms.

In one embodiment, the first case further comprises:

a plurality of posts, being disposed on an outer surface of the first plate;

a first long narrow opening, being formed on the first plate; and a first insertion hole, being formed on the first plate near the first long narrow opening;

wherein an electronic card is allowed to pass through the first long narrow opening, such that a first electrical portion of the electronic card is inserted into a first electrical slot that is disposed on the first main board;

wherein in case the electronic card is inserted into the first electrical slot by the first electrical portion thereof, a second electrical portion of the electronic card being stayed out of the first case of the electronic device.

In one embodiment, there is a first guide assembly disposed on the first main board, and the first guide assembly comprises:

a first supporting board, being disposed on the first main board, and being adjacent to the first electrical slot;

a third guide member, being disposed on the first supporting board, and being close to a first short side of the first electrical slot; and a fourth guide member, being disposed on the first supporting board, and being close to a second short side of the first electrical slot;

wherein the third guide member and the fourth guide member both have a guiding groove, such that two said guiding grooves receive two sides of the electronic card after the electronic card passing through the first long narrow opening.

In one embodiment, the first supporting board is further provided with a card fixing unit thereon, and the card fixing unit comprising:

a second elastic member, having a first end fixed on the first supporting board, a second end and an elastic segment, wherein the elastic segment is connected between the first end and the second end, and being formed with a protrusion block thereon; and wherein after the two sides of the electronic card are received by two said guiding grooves, the elastic segment props the protrusion block against one surface of the electronic card.

In one embodiment, the second plate is further provided with a plurality of post receiving holes and a second long narrow opening thereon, wherein the plurality of post receiving holes are adopted for correspondingly receiving the plurality of posts, and the electronic card is allowed to pass through the second long narrow opening.

In one embodiment, the second case of the external electronic device accommodates a second main board therein, and there is a second guide assembly disposed on the second main board, wherein the second guide assembly comprises:

a second supporting board, being disposed on the second main board, and being adjacent to the second electrical slot;

a fifth guide member, being disposed on the second supporting board, and being close to a first short side of the second electrical slot; and a sixth guide member, being disposed on the second supporting board, and being close to a second short side of the second electrical slot;

wherein the fifth guide member and the sixth guide member both have a guiding groove, such that two said guiding grooves receive two sides of the electronic card after the electronic card passing through the second long narrow opening.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a connection structure for attaching an electronic device onto an external electronic device according to the present invention, embodiments of the present invention will be described in detail with reference to the attached drawings hereinafter.

Connection Structure

Figure 1A:
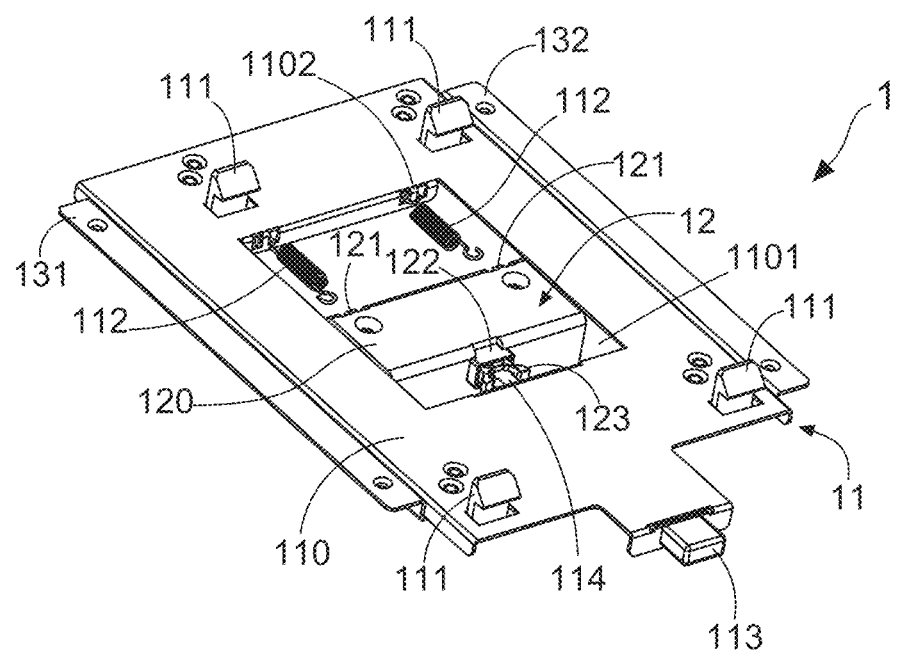
FIG. 1A shows a first stereo diagram of a connection structure according to the present invention.
Figure 1B:
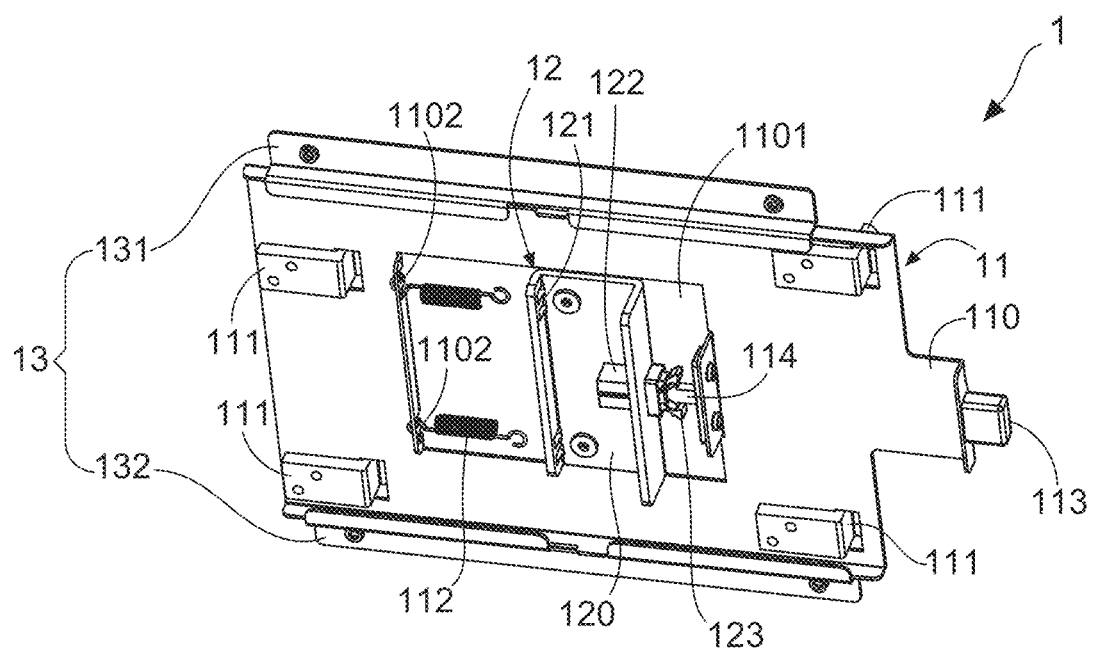
FIG. 1B shows a second stereo diagram of the connection structure according to the present invention.
Figure 2:
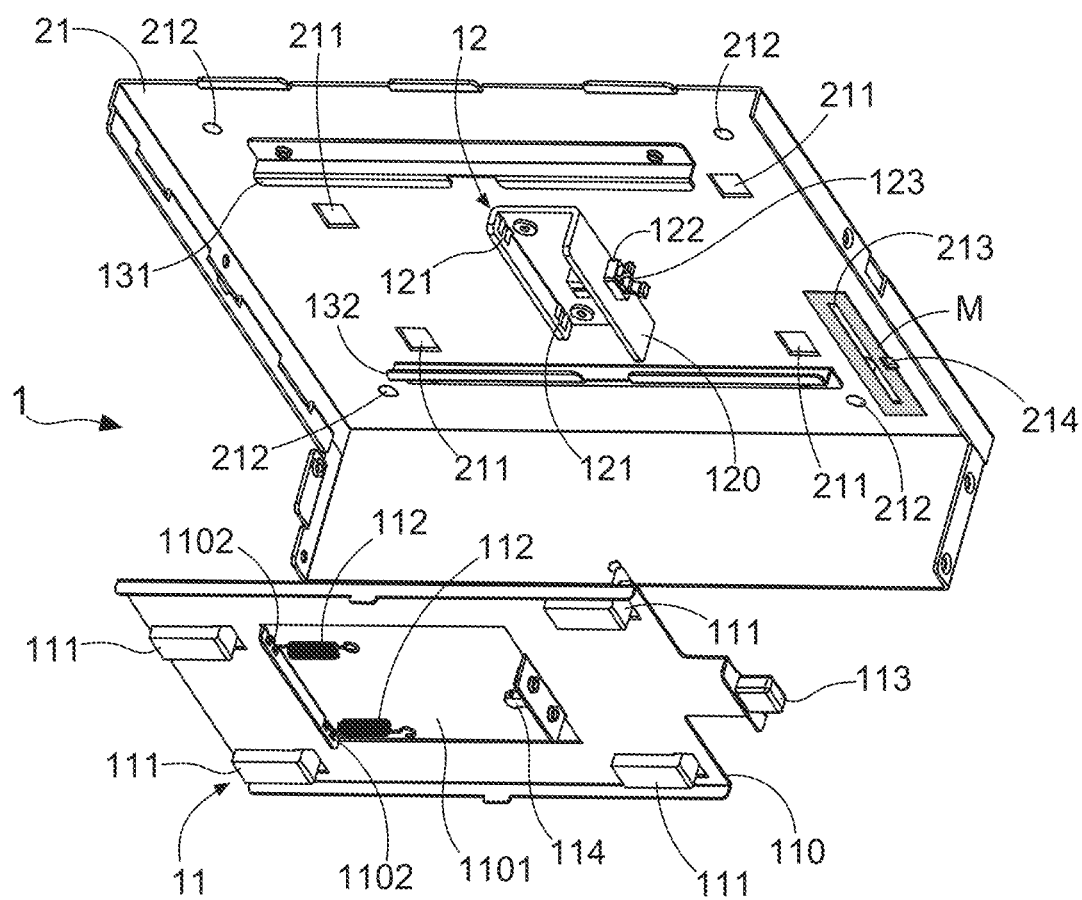
FIG. 2 shows a stereo diagram of a first plate that is disposed with said connection structure thereon.

With reference to FIG. 1A and FIG. 1B, there are shown a first stereo diagram and a second stereo diagram of connection structure according to the present invention. The connection structure 1 comprises: an action unit 11, an assist unit 12 and a guide unit 13 comprising a first guide member 131 and a second guide member 132. FIG. 2 shows a stereo diagram of a first plate that is disposed with said connection structure thereon. As FIG. 1A, FIG. 1B and FIG. 2 show, the action unit 11 is slidably disposed on an inner surface of a first plate 21 that is provided with a plurality of first holes 211 thereon. According to the present invention, the action unit 11 comprises: a first board 110, a plurality of latch members 111, at least one first elastic member 112, and a pressing member 13. As described in more detail below, the first board is provided with an opening thereon, and at least one first connection portion 1102 being set on a first edge of the opening 1101. On the other hand, there is an insertion member 114 disposed on a second edge of the opening 1101, and the second edge and the first edge are two opposite edges of the opening 1101. As FIG. 1A, FIG. 1B and FIG. 2 show, the plurality of latch members 111 are disposed on the first board 110, and each said latch member 111 has a latch head passing through said first hole 211 so as to be exposed out of the first plate 21.

Moreover, the first elastic member 112 is connected to the first connection portion 1102 by a first end thereof, so as to be disposed within the opening 1101. In a practicable embodiment, the first elastic member 112 can be a coil spring or a flat spring. On the other hand, the pressing member 13 is connected to a front side of the first board 110, and a pressing head of the pressing member 13 is exposed out of the first plate 21. As FIG. 1A, FIG. 1B and FIG. 2 show, the assist unit 12 is fixed on the inner surface of the first plate 21 so as to be positioned within the opening 1101. According to the present invention, the assist unit 12 comprises: a second board 120, a receiving member 122, a return spring accommodated in the receiving member 122, and a clamping member 123. In which the receiving member 122 has a receiving groove, and is disposed on the second board 120 so as to be faced to the insertion member 114. Moreover, the return spring and the clamping member 123 are disposed in the receiving groove in turns, of which the clamping member 123 comprises a base portion connected to the return spring and two latch arms.

As described in more detail below, there is a first guiding channel formed between the first guide member 131 and the inner surface of the first plate 21, and there is also a second guiding channel formed between the second guide member 132 and the inner surface of the first plate 21. Furthermore, FIG. 3 shows a stereo diagram of the first plate and a second plate, and FIG. 4A and FIG. 4B show kinematic diagrams of the connection structure 1 according to the present invention.

Figure 4A:
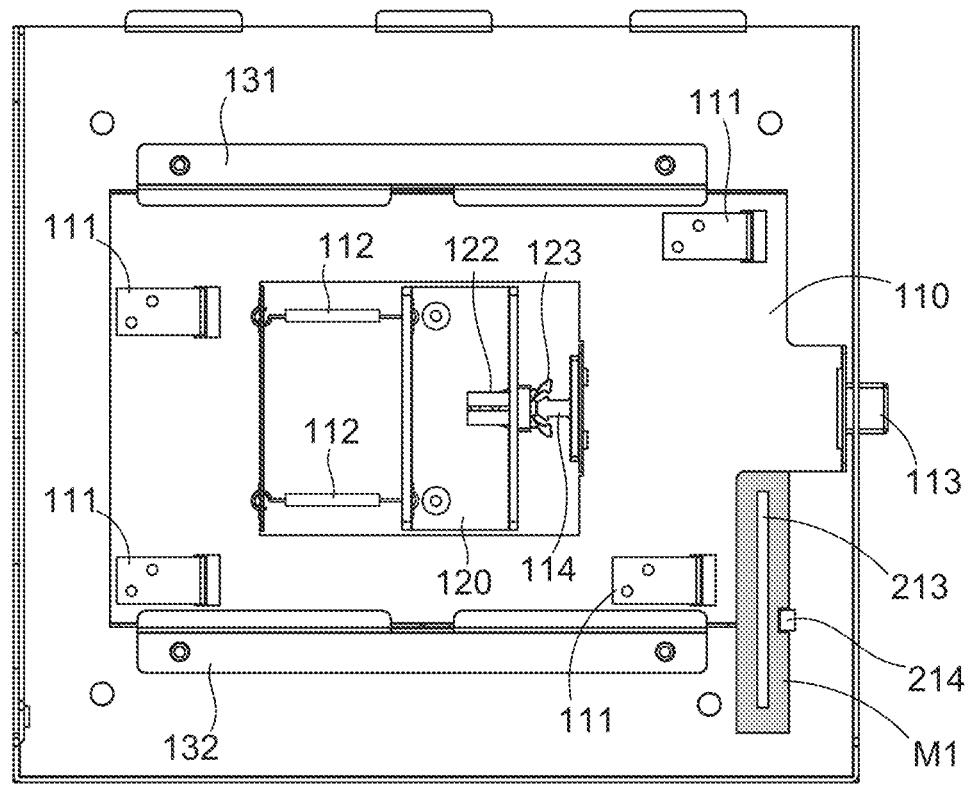
FIG. 4A and FIG. 4B show kinematic diagrams of the connection structure according to the present invention.

According to FIG. 2 and FIG. 4A, in an initial state the first board 110 is subject to an action force (i.e., restoring force) provided by the first elastic member 112, so as to be positioned at a first position. Moreover, after making the plurality of latch members 111 be correspondingly engaged with a plurality of latch holes 311 of a second plate 31, the first plate 21 is connected with the second plate 31. In such case, the first board 110 is eventually stayed at the first position. In addition, the two latch aims of the clamping member 123 are stayed out of the receiving groove of the receiving member 122, such that there is a first included angle between the two latch arms.

Figure 3:
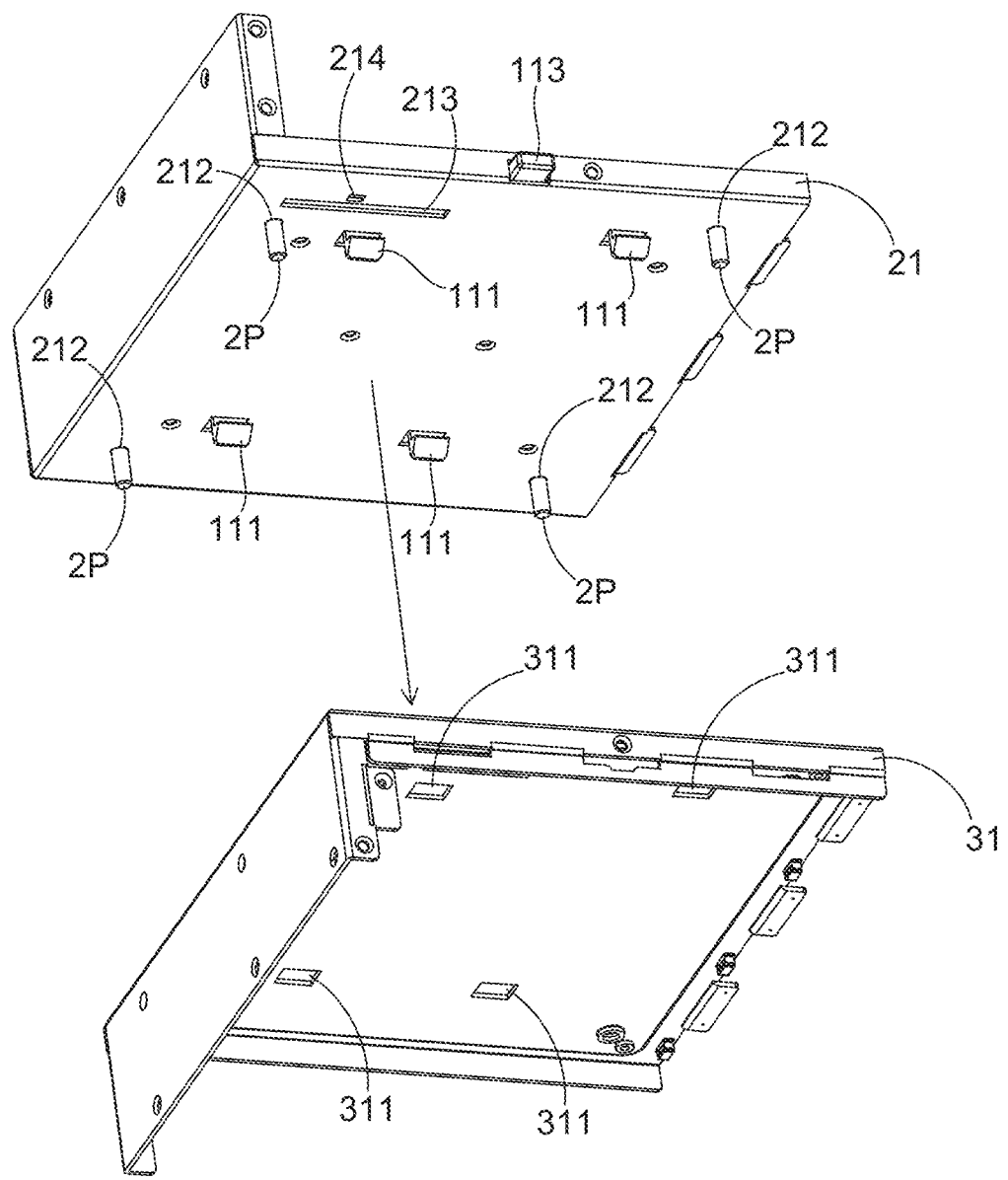
FIG. 3 shows a stereo diagram of the first plate and a second plate.
Figure 4B:
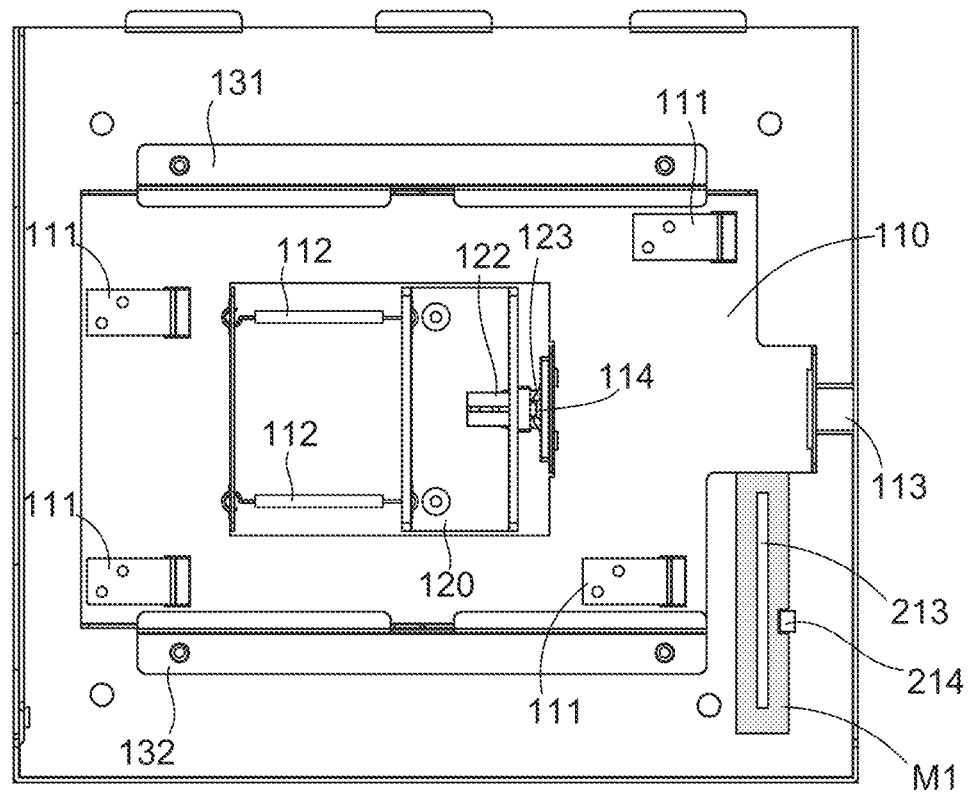

According to FIG. 3 and FIG. 4B, after applying a force to the pressing head of the pressing member 113 so as to push the first board 110 to slide from the first position to a second position, each said latch member 111 not engage with said latch hole 311, such that the first plate 21 is allowed to be separated from the second plate 31. In such case, the insertion member 114 is plugged into the receiving groove, and the two arms are pushed by the insertion member 114 so as to move back into the receiving groove, such that the first included angle between the two latch arms is lessened to a second included angle, and an insertion head of the insertion member 114 are clamped by the two latch arms. Moreover, after the first plate 21 is separated from the second plate 31, applying the force to the pressing head of the pressing member 113 again triggers the first elastic member 112 to provide the action force to the first board 110, such that the first board 110 is pushed to slide back to the first position. In such case, the return spring push the clamping member 123 to move out of the receiving groove at the same time, thereby making the second included angle between the two latch arms be enlarged back to the first included angle.

Electronic Device Having Said Connection Structure

Figure 5:
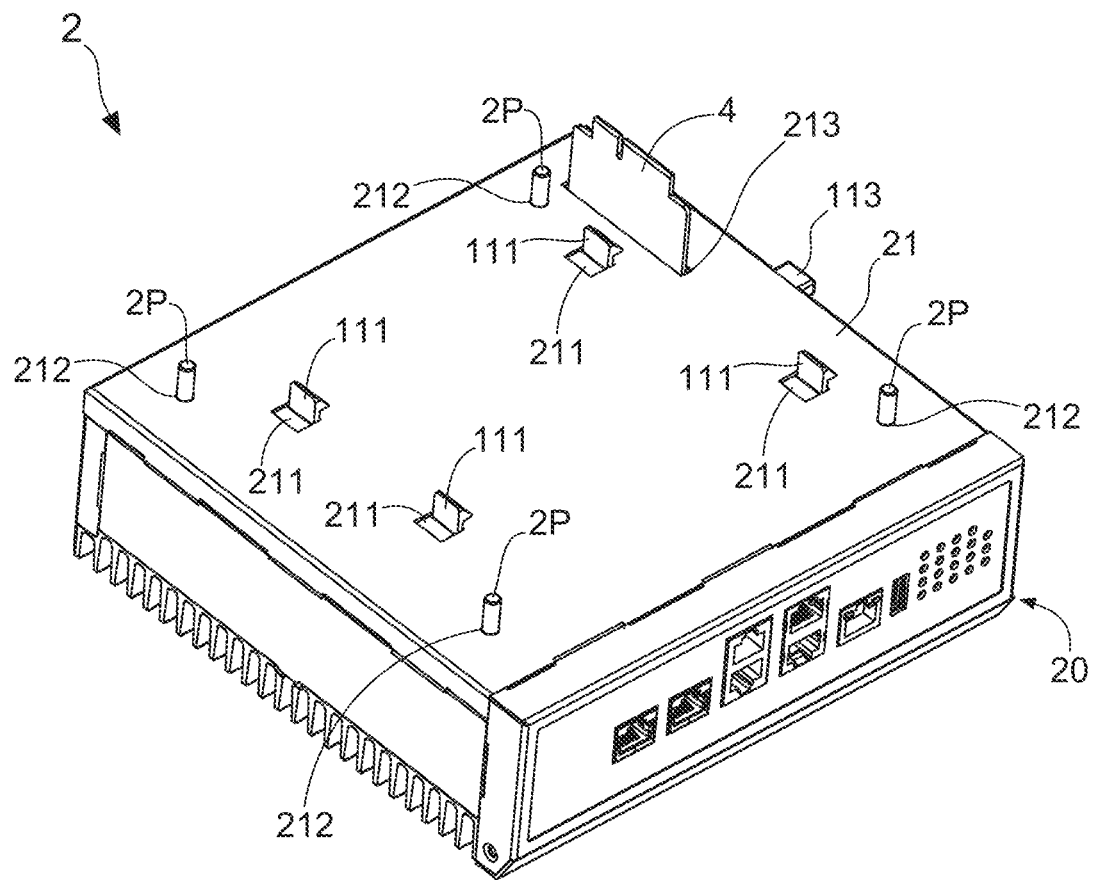
FIG. 5 shows a stereo diagram of an electronic device having said connection structure.

With reference to FIG. 5, there is shown a stereo diagram of an electronic device having said connection structure.

Figure 6:
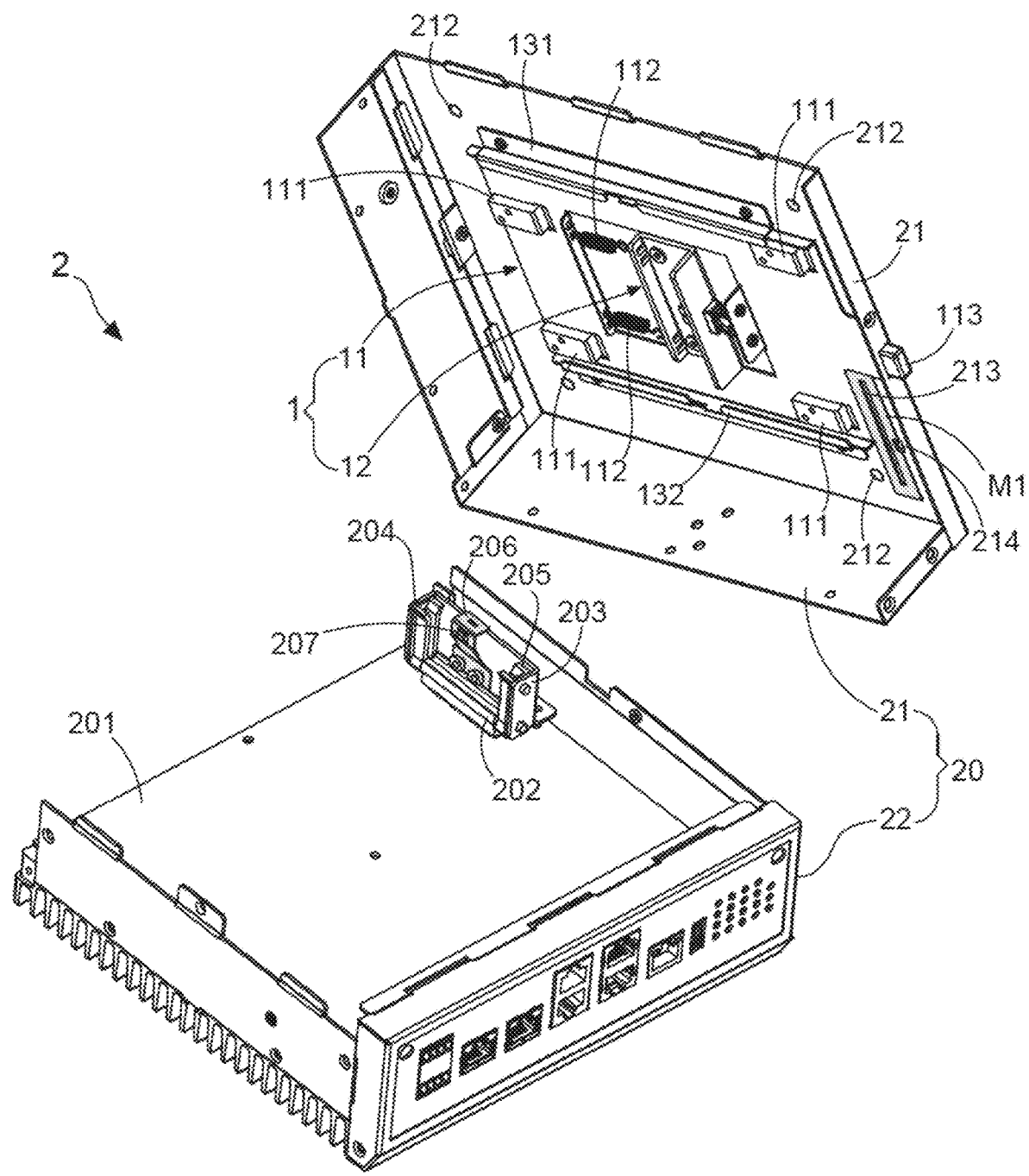
FIG. 6 shows an exploded view of a first case of the electronic device.

Moreover, FIG. 6 shows an exploded view of a first case of the electronic device. According to FIG. 5 and FIG. 6, it is known that the electronic device 2 has a first case 20 accommodating a first main board 201 therein, and the first case 20 consists of a first base 22 and a first cover (i.e., the foregoing first plate 21). In other words, by disposing said connection structure 1 to the inner surface of the first cover of the first case 20, the electronic device 2 therefore includes said connection structure 1, and is allowed to be attached to an external electronic device through the connection structure 1.

FIG. 5 and FIG. 6 depict that there are a plurality of first holes 211, a plurality of posts 2P, a first long narrow opening 213, and a first insertion hole 214 provided on the first plate 21, and each said latch member 111 has a latch head passing through said first hole 211 so as to be exposed out of the first plate 21. Moreover, the plurality of posts 2P is disposed on the outer surface of the first plate 21. By such arrangement, an electronic card 4 is allowed to pass through the first long narrow opening 213, such that a first electrical portion of the electronic card 4 is inserted into a first electrical slot 202 that is disposed on the first main board 201. It is worth noting that, in case the electronic card 4 is inserted into the first electrical slot 202 by the first electrical portion thereof, a second electrical portion of the electronic card 4 is stayed out of the first case 20 of the electronic device 2.

As FIG. 6 shows, there is a first guide assembly disposed on the first main board 21, and the first guide assembly comprises: a first supporting board 203, a third guide member 204 and a fourth guide member 205, of which the first supporting board 203 is disposed on the first main board 201, and is adjacent to the first electrical slot 202. On the other hand, the third guide member 204 is disposed on the first supporting board 203, and is close to a first short side of the first electrical slot 202. Moreover, the fourth guide member 205 is disposed on the first supporting board 203, and is close to a second short side of the first electrical slot 202. According to the present invention, the third guide member 204 and the fourth guide member 205 both have a guiding groove, such that two said guiding grooves receive two sides of the electronic card 4 after the electronic card 4 passing through the first long narrow opening 213.

Furthermore, the first supporting board 203 is provided with a card fixing unit thereon, and the card fixing unit comprises a second elastic member 206. As FIG. 6 shows, the second elastic member 206 has a first end fixed on the first supporting board 203, a second end and an elastic segment, of which the elastic segment is connected between the first end and the second end, and is formed with a protrusion block 207 thereon. By such arrangement, after the two sides of the electronic card 4 are received by two said guiding grooves, the elastic segment props the protrusion block 207 against one surface of the electronic card 4.

Figure 7:
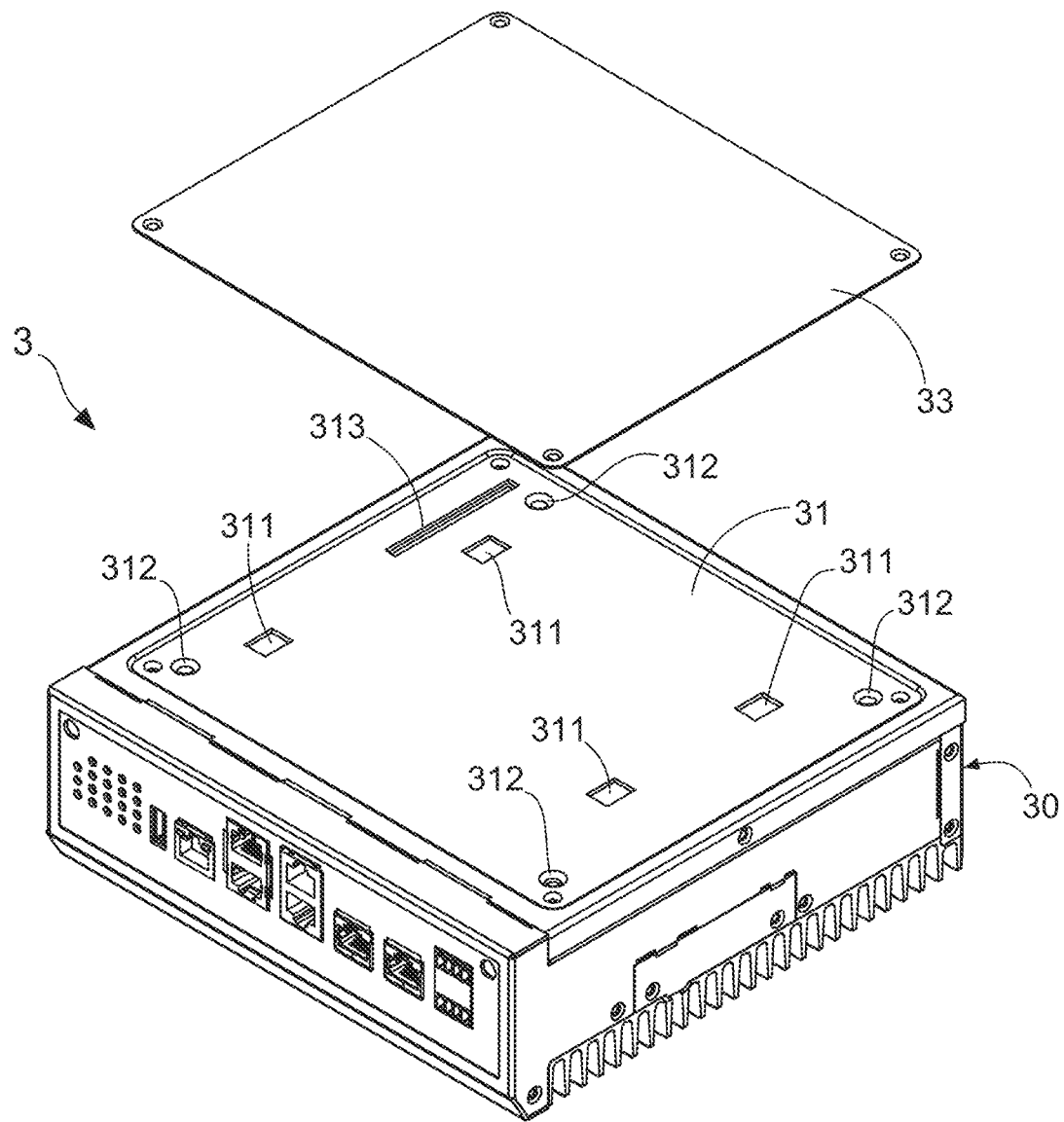
FIG. 7 shows a stereo diagram of an external electronic device.
Figure 8:
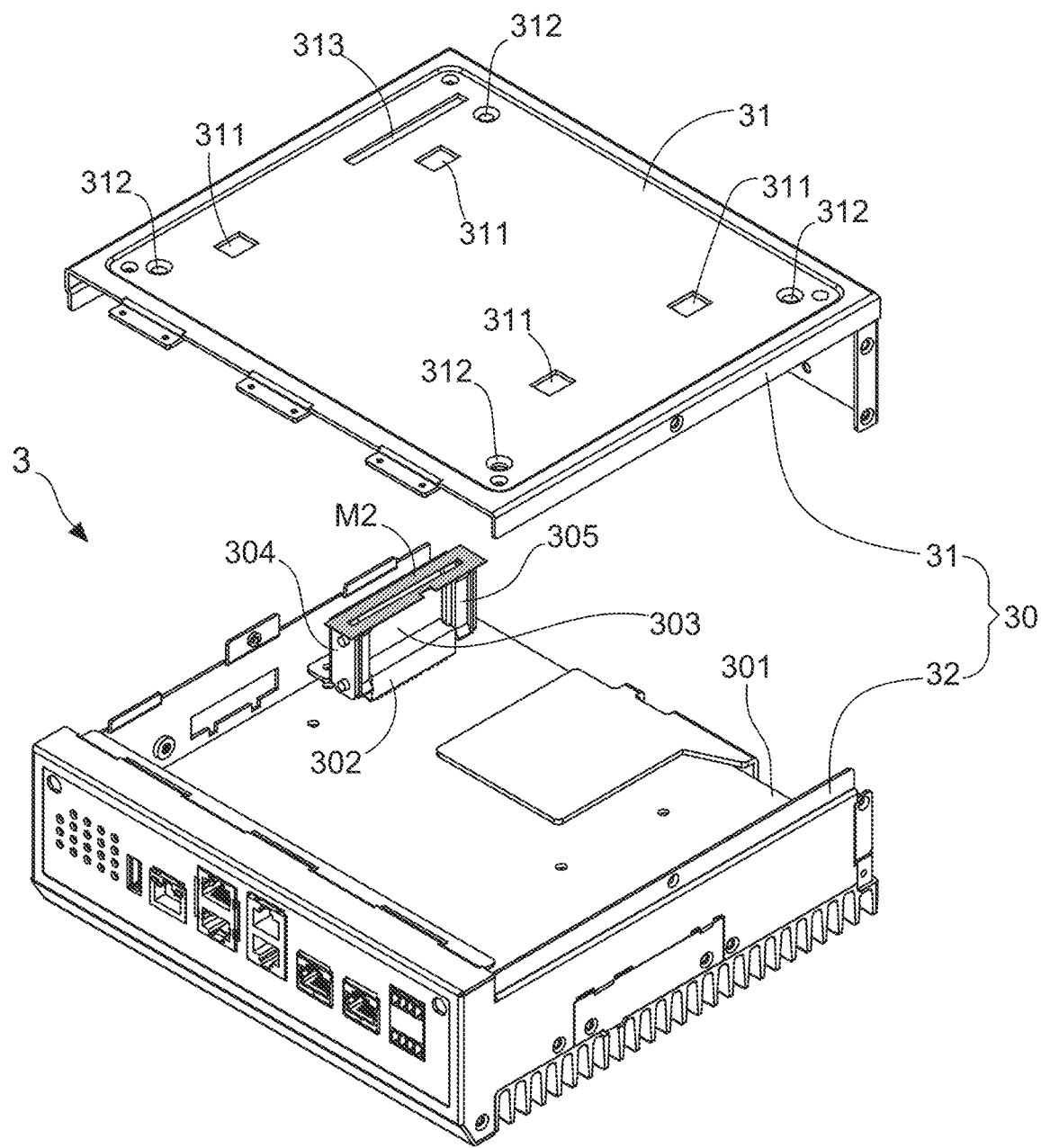
FIG. 8 shows an exploded view of a second case of the external electronic device.

FIG. 7 shows a stereo diagram of an external electronic device. Moreover, FIG. 8 shows an exploded view of a second case of the external electronic device. According to FIG. 7 and FIG. 8, it is known that the external electronic device 3 has a second case 30 accommodating a second main board 301 therein, and the second case 30 consists of a second base 32 and a second cover (i.e., the foregoing second plate 31). In other words, by utilizing said connection structure 1 to make the first plate 21 (i.e., the first cover of the electronic device 2) to connected with the second plate 31, the electronic device 2 is therefore attached to the external electronic device 3.

FIG. 7 and FIG. 8 depict that there are a plurality of latch holes 311, a plurality of post receiving holes 312 and a second long narrow opening 313 provided on the second plate 31. In which the plurality of post receiving holes 312 are adopted for correspondingly receiving the plurality of posts 2P, and the electronic card 4 is allowed to pass through the second long narrow opening 313. Moreover, as FIG. 8 shows, there is a second guide assembly disposed on the first main board 21, wherein the second guide assembly comprises: a second supporting board 303, a fifth guide member 304 and a sixth guide member 305. As described in more detail below, the second supporting board 303 is disposed on the second main board 301, and is adjacent to the second electrical slot 302. Moreover, the fifth guide member 304 is disposed on the second supporting board 303, and is close to a first short side of the second electrical slot 302. On the other hand, the sixth guide member 305 is disposed on the second supporting board 303, and is close to a second short side of the second electrical slot 302. According to the present invention, the fifth guide member 304 and the sixth guide member 305 both have a guiding groove, such that two said guiding grooves receive two sides of the electronic card 4 after the electronic card 4 passing through the second long narrow opening 313.

In addition, FIG. 6 also depicts that a first anti-abrasion sheet M1 is patched on the inner surface of the first plate 21 for covering the first long narrow opening 213, and the first anti-abrasion sheet M1 has a third long narrow opening facing to the first long narrow opening 213. On the other hand, FIG. 8 depicts that a second anti-abrasion sheet M2 is patched on the inner surface of the second plate 31 for covering the second long narrow opening 313, and the second anti-abrasion sheet M2 has a fourth long narrow opening facing to the second long narrow opening 313. It needs to particularly explain that, for clear showing the second anti-abrasion sheet M2, in FIG. 8 the second anti-abrasion sheet M2 is moved to be set on the second guide assembly instead of being patched on the inner surface of the second plate 31.

Figure 9A:
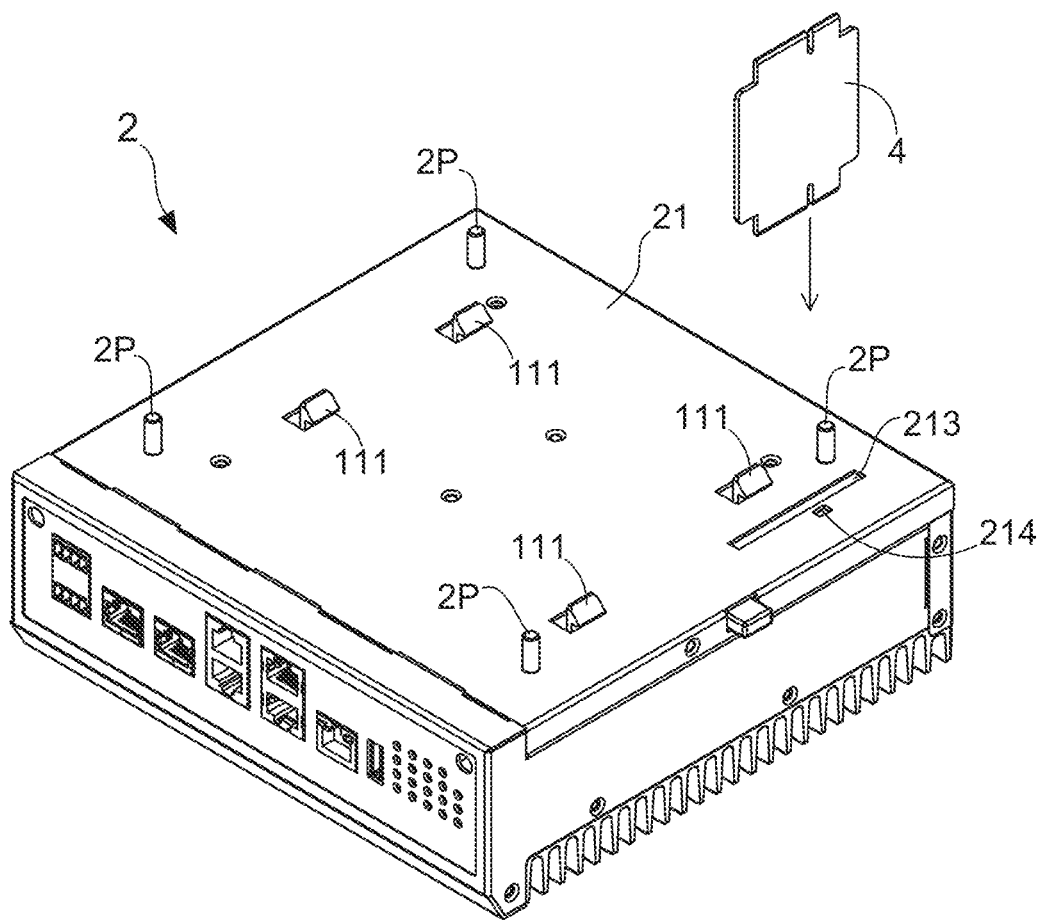
FIG. 9A, FIG. 9B, FIG. 9C and FIG. 9D show diagrams for explaining how to utilize said connection structure to attach the electronic device onto the external electronic device.
Figure 9B:
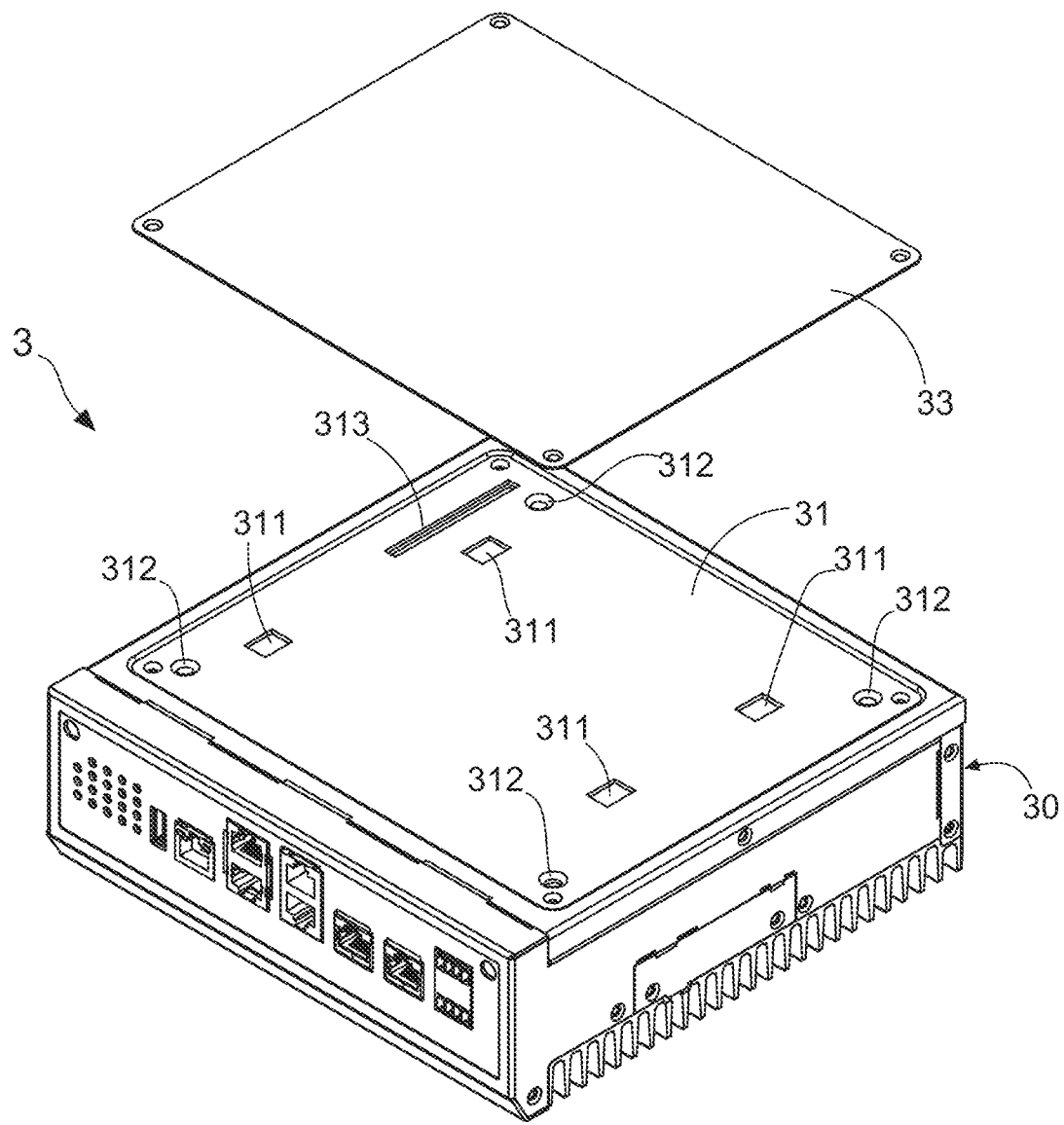
Figure 9C:
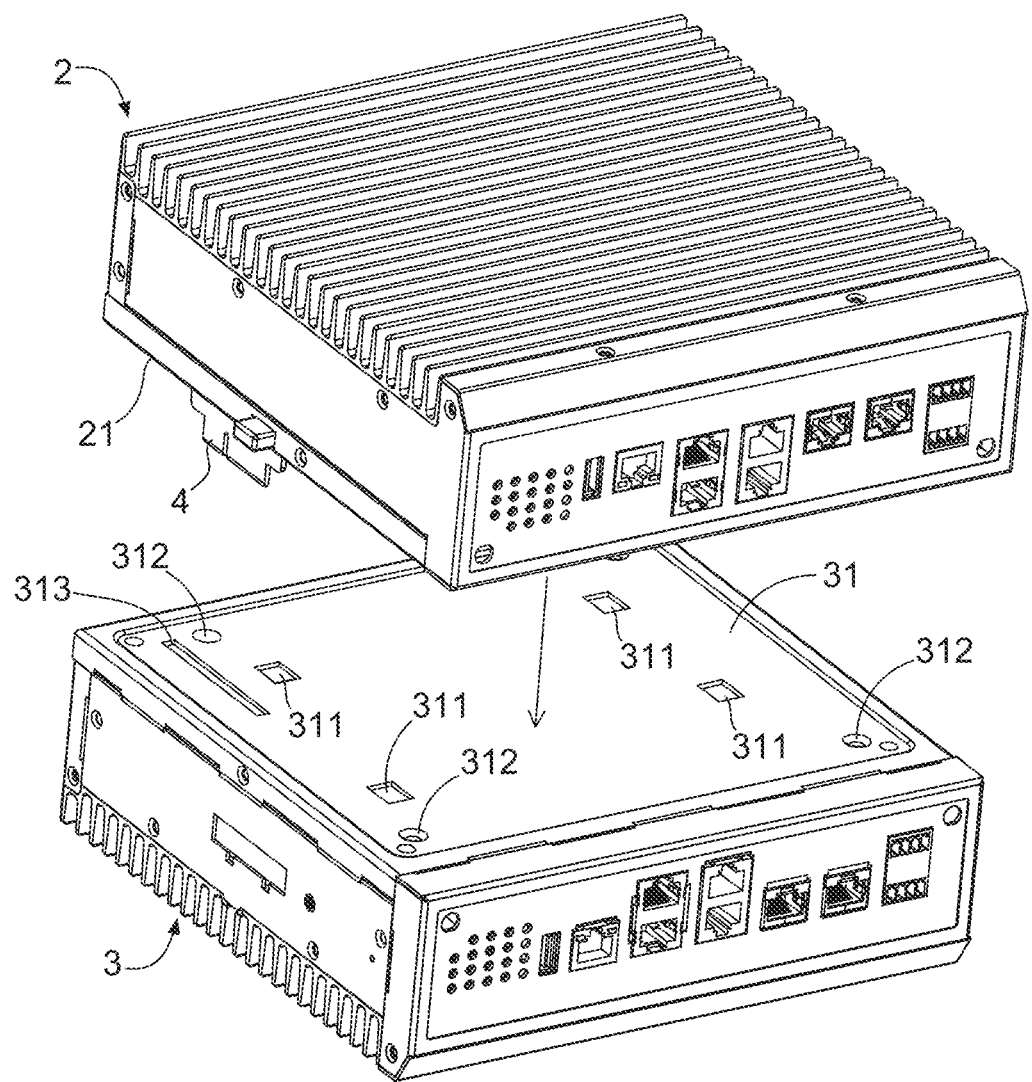

FIG. 9A, FIG. 9B and FIG. 9C show diagrams for explaining how to utilize the connection structure 1 of the present invention to attach the electronic device 2 to the external electronic device 3. As FIG. 9A, FIG. 6 and FIG. 5 show, before connecting the electronic device 2 to the external electronic device 3, it needs to firstly make an electronic card 4 (i.e., a bridge card) to pass through the first long narrow opening 213 of the first plate 21 (i.e., the first cover of the first case 20), and then make a first electrical portion of the electronic card 4 be inserted into a first electrical slot 202 that is disposed on the first main board 201. In such case, a second electrical portion of the electronic card 4 is stayed out of the first case 20, and two sides of the electronic card 4 are received in the guiding groove of the third guide member 204 and the guiding groove of the fourth guide member 205. Moreover, the elastic segment of the second elastic member 206 props the protrusion block 207 against one surface of the electronic card 4. In other words, after the electronic card 4 is inserted into the first case 20 so as to engage with the first electrical slot 202, the electronic card 4 stays on the first electrical slot 202 steadily through the assistance of the card fixing unit.

As FIG. 9B shows, the external electronic device 3 further comprises a cover 33 and, before the external electronic device 3 is arranged to be attached to the electronic device 2 through said connection structure 1, the plurality of latch holes 311, the plurality of post receiving holes 312 and the second long narrow opening 313 are shielded by the cover 33. Therefore, it is easily understood that, it needs to firstly remove the cover 33 from the second case 30 of the external electronic device 3 in case of the electronic device 2 being about to be connect to the external electronic device 3.

Figure 9D:
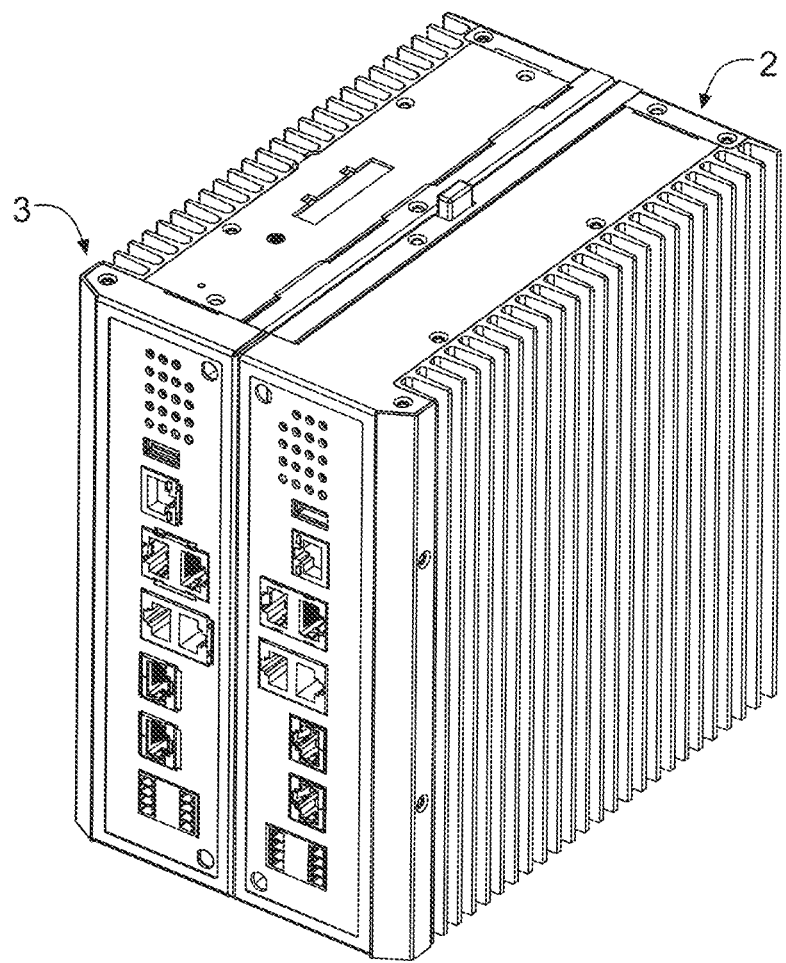

As FIG. 9C and FIG. 3 show, after making the plurality of latch members 111 be correspondingly engaged with a plurality of latch holes 311 of the second plate 31, the first plate 21 is therefore connected with the second plate 31, such that the electronic device 2 is successfully attached to the external electronic device 3. As FIG. 4A and FIG. 9D show, when the first plate 21 is connected with the second plate 31, the first board 110 is subject to an action force provided by the first elastic member 112, so as to be positioned at a first position. Moreover, the electronic card 4 passed through the second long narrow opening 313 of the second plate 31, so as to engage with a second electronic slot 202 by a second electrical portion thereof, thereby making the two electronic devices communicate with to each other through the electronic card 4. As a result, the function(s) of the electronic device 2 is expended.

Figure 10A:
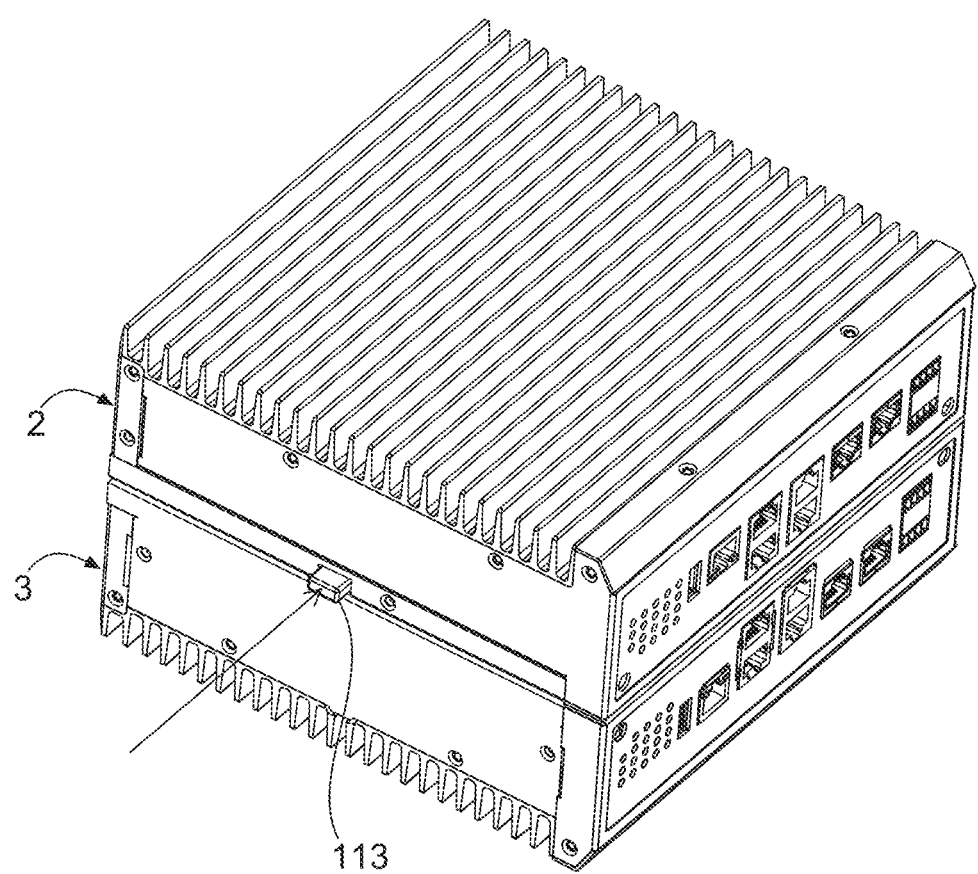
FIG. 10A, FIG. 10B show diagrams for explaining how to separate the electronic device from the external electronic device.
Figure 10B:
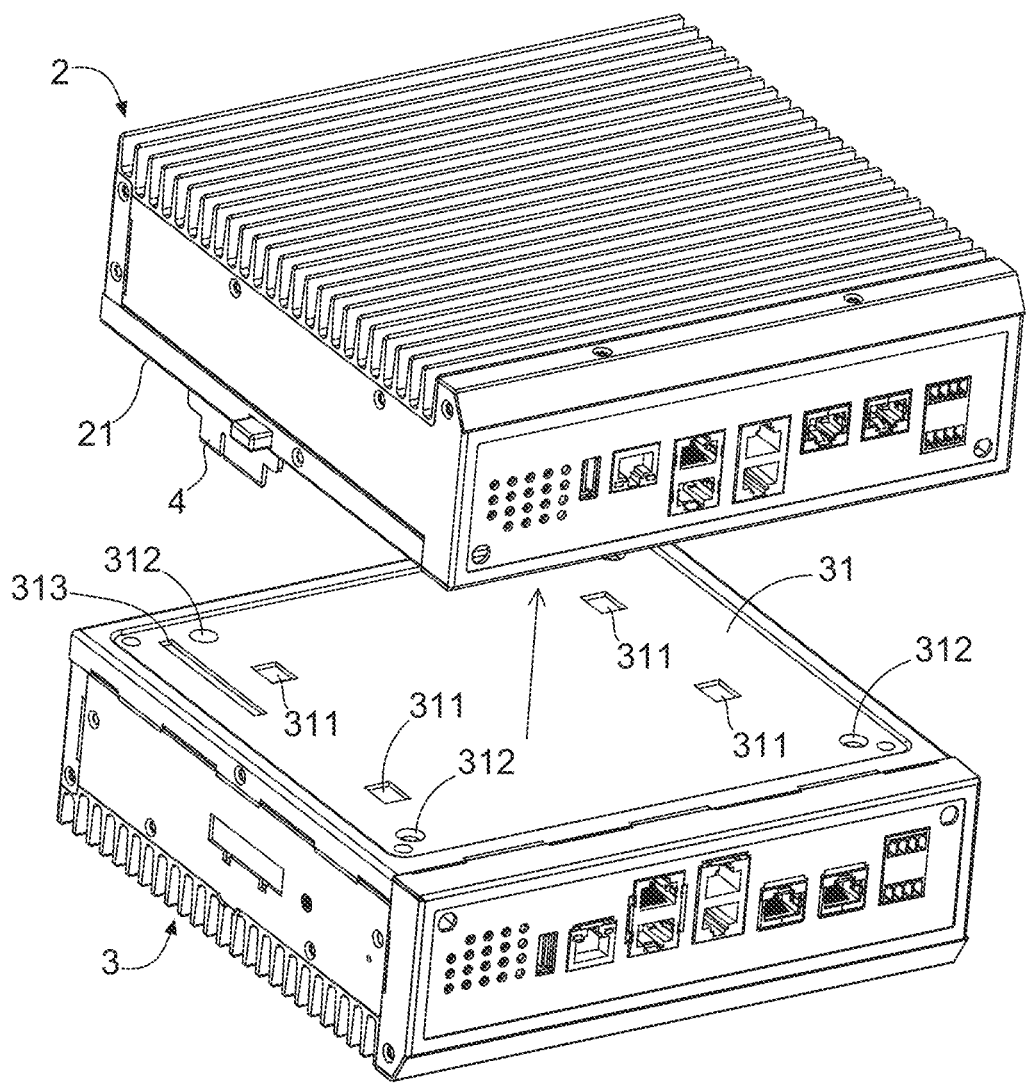

FIG. 10A, FIG. 10B and FIG. 10C show diagrams for explaining how to separate the electronic device from the external electronic device. As FIG. 4B, FIG. 10 and FIG. 10 show, after applying a force to the pressing head of the pressing member 113 so as to push the first board 110 to slide from the first position to a second position, each said latch member 111 not engaging with said latch hole 311, such that the electronic device 2 is allowed to be separated from the external electronic device 3. Furthermore, as FIG. 4A and FIG. 4B show, after the electronic device 2 is separated from the external electronic device 3, applying the force to the pressing head of the pressing member 113 again triggers the first elastic member 112 to provide the action force to the first board 110, such that the first board 110 is pushed to slide back to the first position.

Figure 11A:
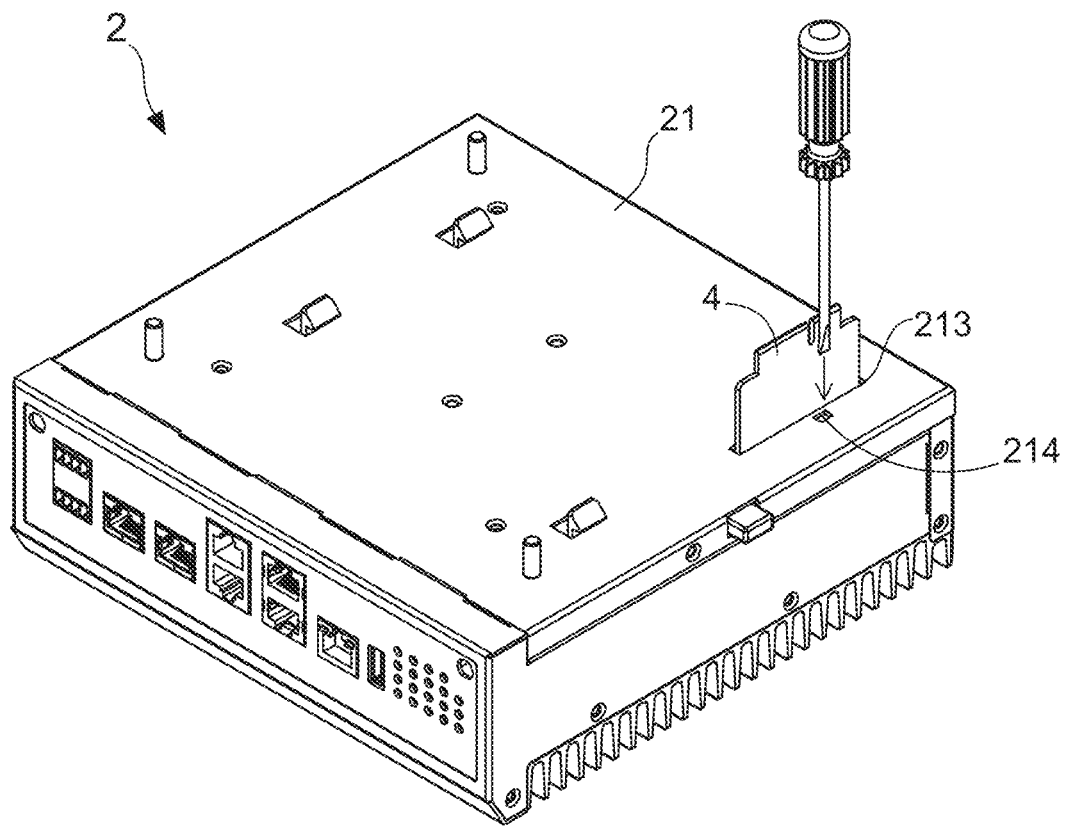
FIG. 11A and FIG. 11B show diagrams for explaining how to take out an electronic card from the electronic device.
Figure 11B:
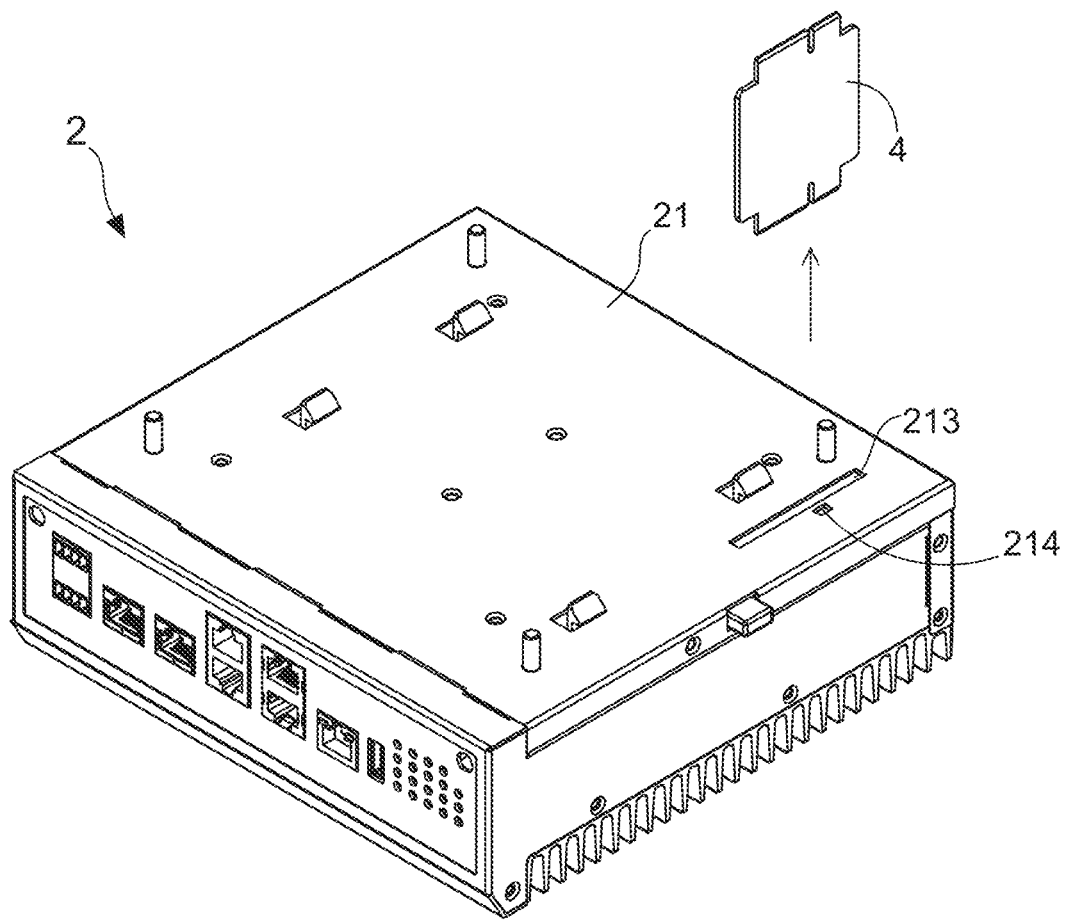

FIG. 11A and FIG. 11B show diagrams for explaining how to take out an electronic card from the electronic device. As FIG. 11A shows, in case the first electrical portion of the electronic card 4 is inserted into the first electrical slot 202, a tool 5 is allowed to be operated so as to pass through the first insertion hole 214, such that the second end of the second elastic member 206 is pressed by a top portion of the tool 5, thereby stopping the elastic segment from propping the protrusion block against the electronic card 4. In such case, the electronic card 4 can be removed from the first electrical slot 202, thereby being moved out of the first case 20.

Therefore, through the above descriptions, all embodiments of the connection structure for attaching one electronic device onto another one electronic device according to the present invention have been introduced completely and clearly. It is worth emphasizing that, the above description is made on embodiments of the present invention. However, the embodiments are not intended to limit the scope of the present invention, and all equivalent implementations or alterations within the spirit of the present invention still fall within the scope of the present invention.

What is claimed is:

1. A connection structure, comprising:
an action unit, being slidably disposed on an inner surface of a first plate, wherein the first plate is provided with a plurality of first holes thereon, and the action unit comprising:
a first board, being provided with an opening thereon, and at least one first connection portion being set on a first edge of the opening;
a plurality of latch members, being disposed on the first board, and each said latch member having a latch head passing through said first hole so as to be exposed out of the first plate;
at least one first elastic member, being connected to the first connection portion by a first end thereof, so as to be disposed within the opening; and
a pressing member, being connected to a front side of the first board, and a pressing head of the pressing member being exposed out of the first plate; and
an assist unit, being fixed on the inner surface of the first plate so as to be positioned within the opening, wherein the assist unit comprises a second board provided with at least one second connection portion thereon, and the first elastic member being connected to the second connection portion by a second end thereof;
wherein after making the plurality of latch members be correspondingly engaged with a plurality of latch holes of a second plate, the first plate being connected with the second plate;
wherein in case the first plate is connected with the second plate, the first board is subject to an action force provided by the first elastic member, so as to be positioned at a first position;
wherein after applying a force to the pressing head of the pressing member so as to push the first board to slide from the first position to a second position, each said latch member not engaging with said latch hole, such that the first plate is allowed to be separated from the second plate;
wherein after the first plate is separated from the second plate, applying the force to the pressing head of the pressing member again triggering the first elastic member to provide the action force to the first board, such that the first board is pushed to slide back to the first position.

2. The connection structure of claim 1, further comprising:
a guide unit, being disposed on the inner surface of the first plate, and comprising a first guide member and a second guide member;
wherein there is a first guiding channel formed between the first guide member and the inner surface of the first plate, and there being also a second guiding channel formed between the second guide member and the inner surface of the first plate;
wherein a left side and a right side of the first board are received by the first guiding channel and the second guiding channel, respectively.

3. The connection structure of claim 1, wherein the first elastic member is selected from a group consisting of coil spring and flat spring.

4. The connection structure of claim 1, wherein there is an insertion member disposed on a second edge of the opening, and the second edge and the first edge being two opposite edges of the openings.

5. The connection structure of claim 4, wherein the assist unit further comprises:
a receiving member having a receiving groove, being disposed on the second board, and being faced to the insertion member;
a return spring, being disposed in the receiving groove; and
a clamping member, being disposed in the receiving groove, and comprising a base portion connected to the return spring and two latch arms;

wherein in case the first board is positioned at the first position, the two latch arms of the clamping member being stayed out of the receiving groove, and there being a first included angle between the two latch arms;

wherein in case the first board slides from the first position to the second position, the insertion member being plugged into the receiving groove, and the two arms being pushed by the insertion member so as to move back into the receiving groove, such that the first included angle between the two latch arms is lessened to a second included angle, and an insertion head of the insertion member being clamped by the two latch arms.

6. The connection structure of claim 5, wherein after the first plate is separated from the second plate, applying the force to the pressing head of the pressing member triggering the first elastic member to provide the action force to drive the first board sliding back to the first position, such that the return spring push the clamping member to move out of the receiving groove at the same time, thereby making the second included angle between the two latch arms be enlarged back to the first included angle.

7. An electronic device comprising a first case that accommodates a first main board therein; characterized in that the electronic device has a connection structure, and the connection structure comprising:
   an action unit, being slidably disposed on an inner surface of a first plate of the first case, wherein the first plate is provided with a plurality of first holes thereon, and the action unit comprising:
   a first board, being provided with an opening thereon, and at least one first connection portion being set on a first edge of the opening;
   a plurality of latch members, being disposed on the first board, and each said latch member having a latch head passing through said first hole so as to be exposed out of the first plate;
   at least one first elastic member, being connected to the first connection portion by a first end thereof, so as to be disposed within the opening; and
   a pressing member, being connected to a front side of the first board, and a pressing head of the pressing member being exposed out of the first plate; and
   an assist unit, being fixed on the inner surface of the first plate so as to be positioned within the opening, wherein the assist unit comprises a second board provided with at least one second connection portion thereon, and the first elastic member being connected to the second connection portion by a second end thereof;
   wherein after making the plurality of latch members be correspondingly engaged with a plurality of latch holes of a second plate that is belong to a second case of an external electronic device, the first plate being connected with the second plate, such that the electronic device is attached to the external electronic device;
   wherein in case the first plate is connected with the second plate, the first board is subject to an action force provided by the first elastic member, so as to be positioned at a first position;
   wherein after applying a force to the pressing head of the pressing member so as to push the first board to slide from the first position to a second position, each said latch member not engaging with said latch hole, such that the electronic device is allowed to be separated from the external electronic device;
   wherein after the electronic device is separated from the external electronic device, applying the force to the pressing head of the pressing member again triggering the first elastic member to provide the action force to the first board, such that the first board is pushed to slide back to the first position.

8. The electronic device of claim 7, wherein the connection structure comprises:
   a guide unit, being disposed on the inner surface of the first plate, and comprising a first guide member and a second guide member;
   wherein there is a first guiding channel formed between the first guide member and the inner surface of the first plate, and there being also a second guiding channel formed between the second guide member and the inner surface of the first plate;
   wherein a left side and a right side of the first board are received by the first guiding channel and the second guiding channel, respectively.

9. The electronic device of claim 7, wherein the first elastic member is selected from a group consisting of coil spring and flat spring.

10. The electronic device of claim 7, wherein there is an insertion member disposed on a second edge of the opening, and the second edge and the first edge being two opposite edges of the opening.

11. The electronic device of claim 10, wherein the assist unit further comprises:
   a receiving member having a receiving groove, being disposed on the second board, and being faced to the insertion member;
   a return spring, being disposed in the receiving groove; and
   a clamping member, being disposed in the receiving groove, and comprising a base portion connected to the return spring and two latch arms;
   wherein in case the first board is positioned at the first position, the two latch arms of the clamping member being stayed out of the receiving groove, and there being a first included angle between the two latch arms;
   wherein in case the first board slides from the first position to the second position, the insertion member being plugged into the receiving groove, and the two arms being pushed by the insertion member so as to move back into the receiving groove, such that the first included angle between the two latch arms is lessened to a second included angle, and an insertion head of the insertion member being clamped by the two latch arms.

12. The electronic device of claim 7, wherein the first case further comprises:
   a plurality of posts, being disposed on an outer surface of the first plate;
   a first long narrow opening, being formed on the first plate; and
   a first insertion hole, being formed on the first plate near the first long narrow opening;
   wherein an electronic card is allowed to pass through the first long narrow opening, such that a first electrical portion of the electronic card is inserted into a first electrical slot that is disposed on the first main board;
   wherein in case the electronic card is inserted into the first electrical slot by the first electrical portion thereof, a second electrical portion of the electronic card being stayed out of the first case of the electronic device.

13. The electronic device of claim 12, wherein there is a first guide assembly disposed on the first main board, and the first guide assembly comprising:
   a first supporting board, being disposed on the first main board, and being adjacent to the first electrical slot;

a third guide member, being disposed on the first supporting board, and being close to a first short side of the first electrical slot; and a fourth guide member, being disposed on the first supporting board, and being close to a second short side of the first electrical slot;

wherein the third guide member and the fourth guide member both have a guiding groove, such that two said guiding grooves receive two sides of the electronic card after the electronic card passing through the first long narrow opening.

14. The electronic device of claim 13, wherein the first supporting board is further provided with a card fixing unit thereon, and the card fixing unit comprising:

a second elastic member, having a first end fixed on the first supporting board, a second end and an elastic segment, wherein the elastic segment is connected between the first end and the second end, and being formed with a protrusion block thereon; and wherein after the two sides of the electronic card are received by two said guiding grooves, the elastic segment propping the protrusion block against one surface of the electronic card.

15. The electronic device of claim 13, wherein in case the first electrical portion of the electronic card is inserted into the first electrical slot, a tool being allowed to be operated so as to pass through the first insertion hole, such that the second end of the second elastic member is pressed by a top portion of the tool, thereby stopping the elastic segment from propping the protrusion block against the electronic card.

16. The electronic device of claim 14, wherein the second plate is further provided with a plurality of post receiving holes and a second long narrow opening thereon, wherein the plurality of post receiving holes are adopted for correspondingly receiving the plurality of posts, and the electronic card being allowed to pass through the second long narrow opening.

17. The electronic device of claim 16, wherein the second case 30 of the external electronic device accommodates a second main board therein, and there being a second guide assembly disposed on the second main board, wherein the second guide assembly comprises:

a second supporting board, being disposed on the second main board, and being adjacent to the second electrical slot;

a fifth guide member, being disposed on the second supporting board, and being close to a first short side of the second electrical slot; and a sixth guide member, being disposed on the second supporting board, and being close to a second short side of the second electrical slot;

wherein the fifth guide member and the sixth guide member both have a guiding groove, such that two said guiding grooves receive two sides of the electronic card after the electronic card passing through the second long narrow opening.

18. The electronic device of claim 16, wherein a first anti-abrasion sheet is patched on the inner surface of the first plate for covering the first long narrow opening, and the first anti-abrasion sheet having a third long narrow opening facing to the first long narrow opening.

19. The electronic device of claim 18, wherein a second anti-abrasion sheet is patched on the inner surface of the second plate for covering the second long narrow opening, and the second anti-abrasion sheet having a fourth long narrow opening facing to the second long narrow opening.

20. The electronic device of claim 16, wherein the external electronic device further comprises a cover and, before the external electronic device is arranged to be attached to the electronic device through said connection structure, the plurality of latch holes, the plurality of post receiving holes and the second long narrow opening being shielded by the cover.

* * * * *